US012001317B2

(12) United States Patent
Jain et al.

(10) Patent No.: US 12,001,317 B2
(45) Date of Patent: *Jun. 4, 2024

(54) WAVEFORM BASED RECONSTRUCTION FOR EMULATION

(71) Applicant: Synopsys, Inc., Sunnyvale, CA (US)

(72) Inventors: Gagan Vishal Jain, Milpitas, CA (US); Johnson Adaikalasamy, Sunnyvale, CA (US); Alexander John Wakefield, Fort Lauderdale, FL (US); Ritesh Mittal, Sunnyvale, CA (US); Solaiman Rahim, San Francisco, CA (US); Olivier Coudert, San Francisco, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,361

(22) Filed: Jun. 27, 2023

(65) Prior Publication Data

US 2023/0342283 A1   Oct. 26, 2023

Related U.S. Application Data

(60) Continuation of application No. 17/454,589, filed on Nov. 11, 2021, now Pat. No. 11,726,899, which is a
(Continued)

(51) Int. Cl.
   *G06F 11/36* (2006.01)
   *G06F 30/331* (2020.01)

(52) U.S. Cl.
   CPC ...... *G06F 11/3652* (2013.01); *G06F 11/3636* (2013.01); *G06F 11/3656* (2013.01); *G06F 30/331* (2020.01)

(58) Field of Classification Search
   USPC .......................................... 703/28
   See application file for complete search history.

(56) References Cited

U.S. PATENT DOCUMENTS 6,009,256 A   12/1999  Tseng et al.
6,053,947 A    4/2000  Parson
(Continued)

FOREIGN PATENT DOCUMENTS

TW    394900 B   6/2000
TW   I292099 B   1/2008
TW   I472912 B   2/2015

OTHER PUBLICATIONS

Zhimin Chen and P. Schaumont, "Early feedback on side-channel risks with accelerated toggle-counting," 2009 IEEE International Workshop on Hardware-Oriented Security and Trust, Francisco, CA, 2009, pp. 90-95, doi: 10.1109/HST.2009.5224961. (Year: 2009).*
(Continued)

*Primary Examiner* — Andrew M. Lyons
(74) *Attorney, Agent, or Firm* — Fenwick & West LLP

(57) ABSTRACT

A process is disclosed to identify the minimal set of sequential and combinational signals needed to fully reconstruct the combinational layout after emulation is complete. A minimal subset of sequential and combinational elements is output from the emulator to maximize the emulator speed and limit the utilization of emulator resources, e.g., FPGA resources. An efficient reconstruction of combinational waveforms or SAIF data is performed using a parallel computing grid.

20 Claims, 16 Drawing Sheets

Related U.S. Application Data division of application No. 15/811,010, filed on Nov. 13, 2017, now Pat. No. 11,200,149.

(60) Provisional application No. 62/421,167, filed on Nov. 11, 2016.

(56) References Cited

U.S. PATENT DOCUMENTS

| | | | |
|---|---|---|---|
| 6,061,511 | A | 5/2000 | Marantz et al. |
| 6,073,194 | A * | 6/2000 | Lowe .................. G06F 13/4027 716/108 |
| 6,295,623 | B1 * | 9/2001 | Lesmeister ........ G01R 31/3193 714/724 |
| 6,317,381 | B1 | 11/2001 | Gans et al. |
| 6,389,379 | B1 | 5/2002 | Lin et al. |
| 6,785,873 | B1 * | 8/2004 | Tseng ...................... G06F 30/33 716/108 |
| 7,716,036 | B2 * | 5/2010 | Musselman ............. G06F 30/33 703/27 |
| 8,082,139 | B1 | 12/2011 | Ballagh et al. |
| 8,250,500 | B1 | 8/2012 | Neto et al. |
| 8,265,918 | B1 | 9/2012 | Neema et al. |
| 8,640,064 | B1 | 1/2014 | Liddell et al. |
| 8,706,467 | B2 | 4/2014 | Rabinovitch et al. |
| 9,286,424 | B1 | 3/2016 | Larzul et al. |
| 9,372,947 | B1 | 6/2016 | Elmufdi et al. |
| 9,852,244 | B2 | 12/2017 | Larzul et al. |
| 2002/0072889 | A1 | 6/2002 | Hoffman et al. |
| 2003/0105617 | A1 | 6/2003 | Cadambi et al. |
| 2004/0107087 | A1 | 6/2004 | Fukui et al. |
| 2006/0036427 | A1 | 2/2006 | Chaumont et al. |
| 2006/0074622 | A1 | 4/2006 | Scott et al. |
| 2007/0265823 | A1 * | 11/2007 | Cha ........................ G06F 30/331 703/24 |
| 2008/0140379 | A1 | 6/2008 | Shah et al. |
| 2009/0083682 | A1 | 3/2009 | Akiba et al. |
| 2010/0057426 | A1 | 3/2010 | Reblewski |
| 2010/0251192 | A1 | 9/2010 | Nishide |
| 2010/0280814 | A1 | 11/2010 | Rabinovitch et al. |
| 2011/0251836 | A1 * | 10/2011 | Wang .................... G06F 30/331 703/28 |
| 2012/0117413 | A1 | 5/2012 | Asaad et al. |
| 2013/0298102 | A1 | 11/2013 | Kadkade et al. |
| 2014/0013290 | A1 | 1/2014 | Lyons et al. |
| 2014/0032204 | A1 | 1/2014 | Suresh et al. |
| 2014/0052430 | A1 | 2/2014 | Suresh et al. |
| 2016/0098505 | A1 | 4/2016 | Larzul |
| 2016/0314239 | A1 | 10/2016 | Rabinovitch et al. |
| 2016/0328499 | A1 | 11/2016 | Larzul et al. |
| 2017/0103156 | A1 | 4/2017 | Gupta et al. |

OTHER PUBLICATIONS

Anonymous, "Detect Cycle in a direct graph using colors," GeeksforGeeks, Mar. 14, 2016, nine pages, [Online] [Retrieved on Apr. 14, 2020], Retrieved from the Internet<URL:https://web.archive.org/web/20160314233718/https://www.geeksforgeeks.org/-detect-cycle-direct-graph-using-colors/>.

Anonymous, "SynaptiCAD Tutorials," SynaptiCAD Sales, Inc., Nov. 14, 2011, 236 pages, [Online] [Retrieved on Apr. 15, 2020], Retrieved from the Internet<URL:http://www.syncad.com/pdf-docs/SynapticadTutorials.pdf>.

Banerjee, S. et al. "Enhanced Tracing and Visibility in Logic Emulation Environment by Optimized Design Slicing," 4th Asia Symposium on Quality Electronic Design, Jul. 10, 2012, pp. 191-199.

Cheng, W.-H. et al., "An Efficient Mechanism to Provide Full Visibility for Hardware Debugging," 2006 IEEE International Symposium on Circuits and Systems, May 21, 2006, pp. 811-814.

Chuang, C.L. et al. "A Snapshot Method to Provide Full Visibility for Functional Debugging Using FPGA," 13th Asian Test Symposium, Nov. 15, 2004, pp. 164-169.

Chuang, C.L. et al. "Hybrid Approach to Faster Functional Verification with Full Visibility," IEEE Design & Test of Computers, vol. 24, No. 2, Jun. 18, 2007, pp. 154-162.

European Patent Office, Supplementary Partial European Search Report, Application No. 17868631.7, May 4, 2020, 22 pages.

Marantz, J., "Enhanced Visibility and Performance in Functional Verification by Reconstruction," IEEE, DAC '98: Proceedings of the 35th annual Design Automation Conference, Jun. 15, 1998, pp. 164-169.

PCT International Search Report and Written Opinion, PCT Application No. PCT/US17/61172, dated Mar. 23, 2018, 18 pages.

PCT Invitation to Pay Additional Fees, PCT Application No. PCT/US17/61172, dated Jan. 24, 2018, 3 pages.

Taiwan Intellectual Property Office, Office Action, Taiwan Application No. 106138955, dated Dec. 22, 2018, 14 pages.

United States Office Action, U.S. Appl. No. 15/811,010, filed Mar. 24, 2021, 24 pages.

United States Office Action, U.S. Appl. No. 15/811,010, filed May 27, 2020, 22 pages.

United States Office Action, U.S. Appl. No. 15/811,010, filed Nov. 24, 2020, 28 pages.

United States Office Action, U.S. Appl. No. 17/454,589, filed Dec. 15, 2022, 25 pages.

* cited by examiner

WAVEFORM BASED RECONSTRUCTION FOR EMULATION

CROSS REFERENCE TO RELATED APPLICATIONS

This application is a continuation of U.S. application Ser. No. 17/454,589, filed Nov. 11, 2021, which is a divisional of U.S. application Ser. No. 15/811,010, (now U.S. Pat. No. 11,200,149) filed Nov. 13, 2017, which claims the benefit of U.S. Provisional Application No. 62/421,167, entitled "Waveform Based Reconstruction for Emulation," filed Nov. 11, 2016, the contents of each of which is incorporated by reference herein in its entirety.

BACKGROUND

An emulation system executes at a fast speed and generates a very large amount of data for post-emulation analysis (such as, debugging, power-estimation, etc.). Traditional approaches to generate a waveform or Switching Activity Interchange Format (SAIF) data involves dumping large amounts of data from the emulator, which causes traditional approaches to suffer from one or more of the following limitations: 1) if all sequential and combinational signals are dumped from the emulator the speed is slow due to limits on the data bandwidth from the emulator hardware; 2) dumping all sequential and combinational signals requires additional hardware resource inside the emulator causing capacity or speed problems; or 3) if only sequential elements are dumped and all combinational signals reconstructed offline using multiple parallel event-based simulators the reconstruction process becomes slow.

SUMMARY

A process is disclosed to identify the minimal set of sequential and combinational signals needed to fully reconstruct the combinational layout after emulation is complete. A minimal subset of sequential and combinational elements is output from the emulator to maximize the emulator speed and limit the utilization of emulator resources, e.g., FPGA resources. An efficient reconstruction of combinational waveforms or SAIF data is performed using a parallel computing grid.

BRIEF DESCRIPTION OF THE DRAWINGS

To easily identify the discussion of any particular element or act, the most significant digit or digits in a reference number refer to the figure number in which that element is first introduced.

Figure (FIG. 1 is an exemplary high-level block diagram of a hardware verification system 100, in accordance with one embodiment of the present invention.

DETAILED DESCRIPTION

Figure 1:
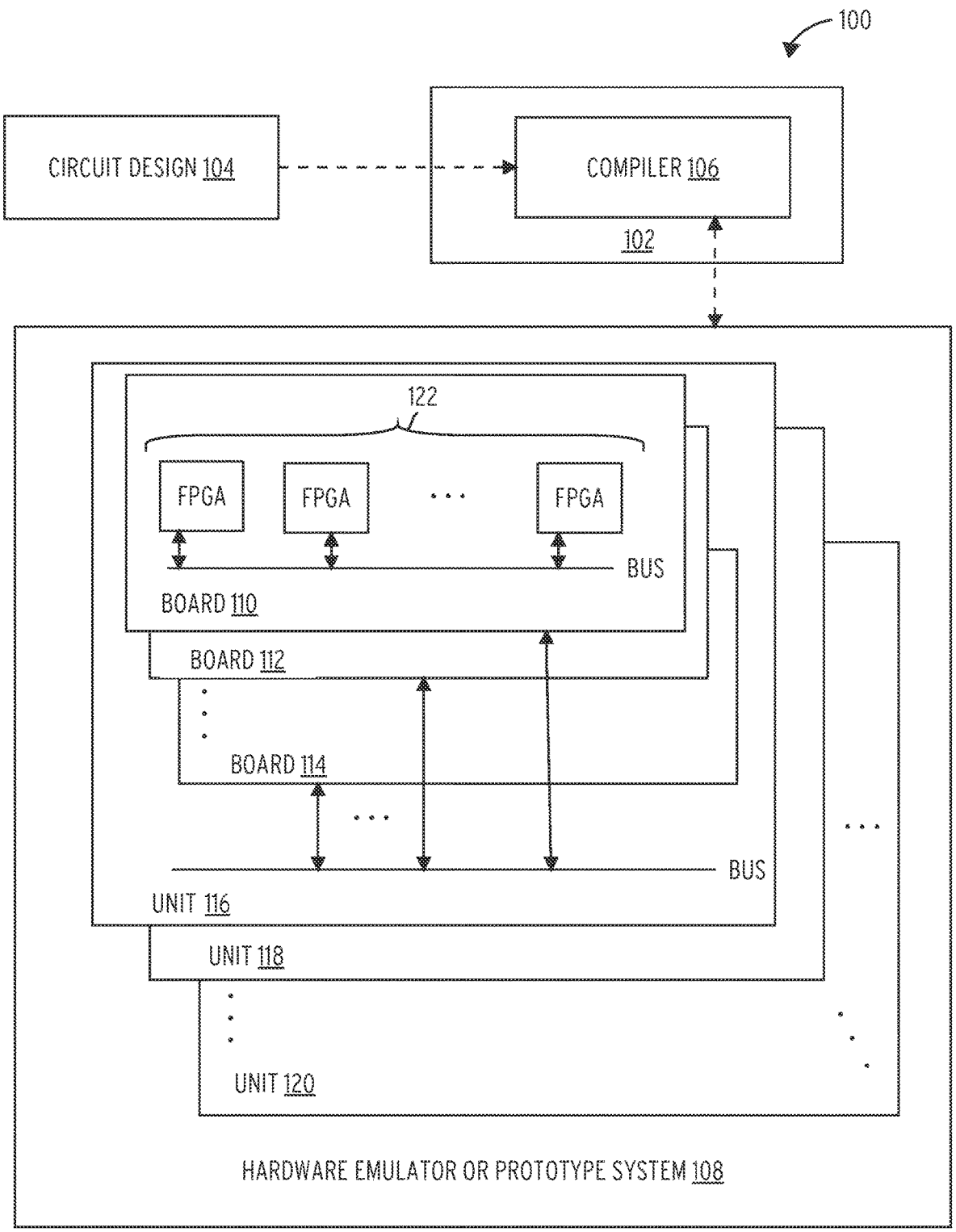

The disclosed embodiments may improve the efficiency of emulation and testing of the various circuit features, including:
1. Combinational loops and feedback
2. Efficient Multi-processor based calculation
3. Back trace invalidation
4. Calculation of a time-slice
5. Time vectorization
6. Data Dump Barriers During compilation of the design under test (DUT), the combinational loops may be identified and the feedback value captured (becoming one of the sequential elements captured during the emulation run), to reduce the number of loops in the logic evaluation.

Efficient multi-processor based calculation involves balancing the processing tree depth, and algorithms to minimize the number of outstanding or calculated waveforms stored in memory. A lightweight scheduler processing unit and the use of N heavyweight calculation processing units may achieve close to 100% efficiency.

When a subset of flops in the DUT are captured to reduce memory resource utilization, then the flop values may be captured at the start of a time slice, allowing the initial value of any logic to be known.

Signals with high number of associated events may be transformed into a time-vector notation, with each bit of a data-word represented on a time step. Single-opcode evaluations such as AND or OR may be completed on large data-words in one clock cycle. For example, a 64-bit AND of the data word may be performed, rather than 64 individual one-bit AND operations.

Conventional data transfers from the emulator utilize buffers built into the emulator. These buffers enable the emulator to transfer larger data sections to the host computer system when the buffers are full. This may cause some data of the DUT overall to arrive at the host computer system out of order. The host computer system may read the entire data dump to search for the data that could be present for a specific signal. Forcing the emulator to flush all data-buffers and adding a data-dump barrier into the dumped data file may allow the post-processing tools of the host computer system to slice the input data at these buffer boundaries. This may reduce memory utilization as the host computer system does not need to read the entire data-file into memory or read it multiple times.

The example embodiments described herein may be used in conjunction with an emulation environment that performs a simulation to construct a waveform of a target signal. For example, the example embodiments described herein may be used with the emulation and simulation techniques described in U.S. Patent Application Publication No. 2017/0091360, which is incorporated herein by reference in its entirety.

Loop Breaking

In traditional event-based simulation, waveform reconstruction is performed by simulating events in time order. A list of the events is maintained by the simulator, and the events are processed before time is advanced to the next time-step. If combinational or sequential loops are present in the circuit design, the values known from the previous time step are used to calculate the values for the next time step.

Waveform calculation iterates over the design once, processing the events for each element in the design at one time. Each design element in the design is scheduled for evaluation after the input signals are known.

Figure 2:
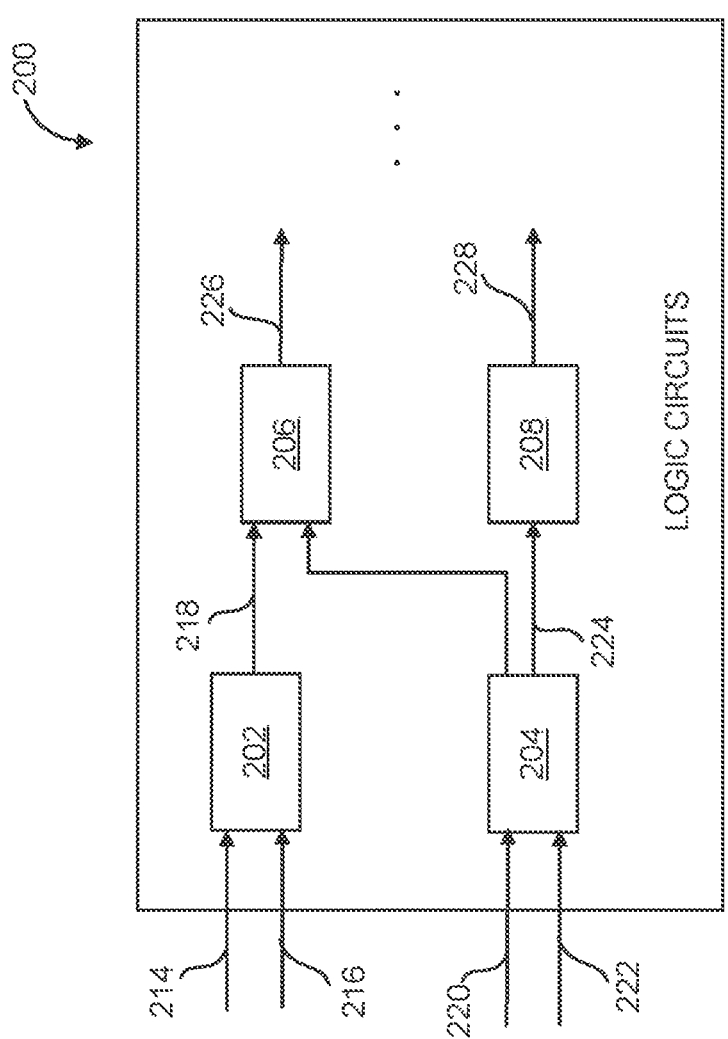
FIG. 2 illustrates logic circuits 200 in accordance with one example embodiment.

For example, in FIG. 2, a logic circuit 202 and a logic circuit 204 may be evaluated immediately as a signal 214, a signal 216, a signal 220, and a signal 222 are known primary inputs to logic circuits 200, and their values are captured in emulation. A logic circuit 208 which receives input signal 224, from logic circuit 204, can only be evaluated after the logic circuit 204 is evaluated because signal 224 is needed to evaluate the logic circuit 208. Similarly, a logic circuit 206 is evaluated after the logic circuit 202 and the logic circuit 204 are evaluated because outputs of logic circuit 202 and 204 are inputs to logic circuit 206.

In traditional event-based simulation, a problem occurs when there is a feedback loop inside the design. In this case, a logic circuit may never be evaluated if its inputs are never fully known. As disclosed herein, combinational feedback loops, such as the feedback loop shown in FIG. 3, can be broken, and an optimal location within this loop captured during emulation.

Figure 3:
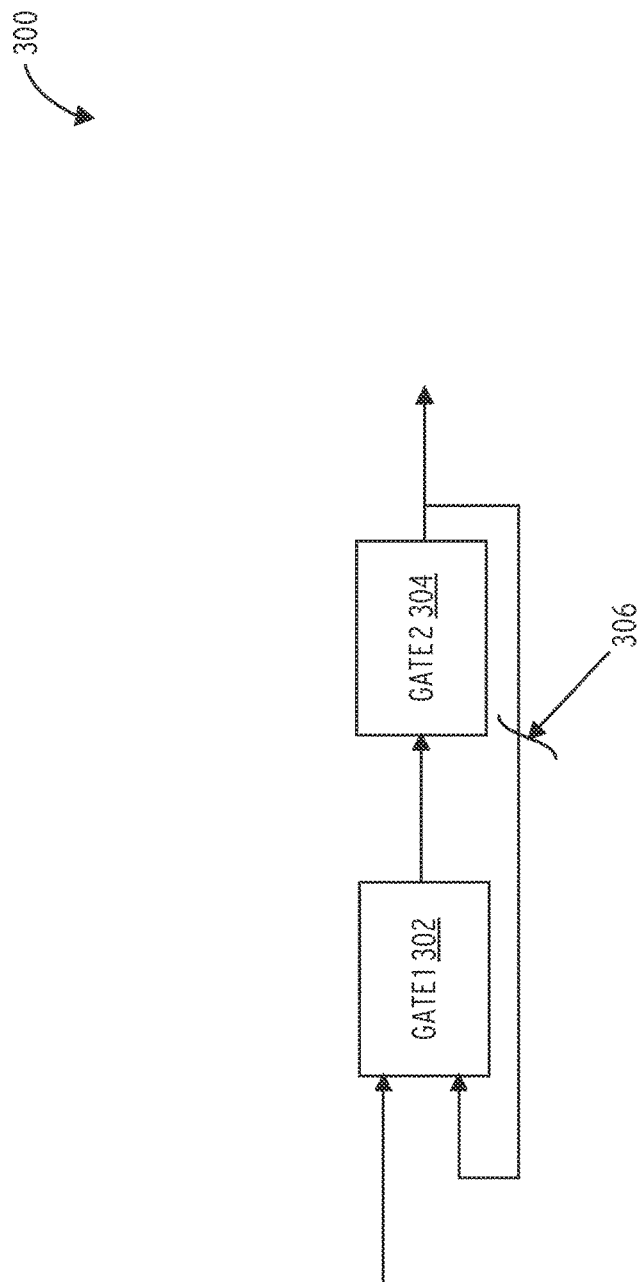
FIG. 3 illustrates an example embodiment of a combination loop 300.

Referring to FIG. 3, a combination loop 300 comprises a first gate 302, a second gate 304, and a loop break 306. Gates 302 and 304 are examples of logic circuits.

During compilation of the DUT, the combinational loops are identified and the feedback value captured, to help ensure that there are no loops in the logic evaluation. The feedback value may become one of the sequential elements captured during the emulation run.

If there is a feedback loop inside a design, a logic circuit (such as first gate 302 and second gate 304) may not be evaluated as the input to the first gate 302 fed back from the second gate 304, and the output from the first gate 302 which is input to the second gate 304, are not fully known. A combination loop 300 may be broken at the loop break 306 and such location captured during emulation.

Figure 5:
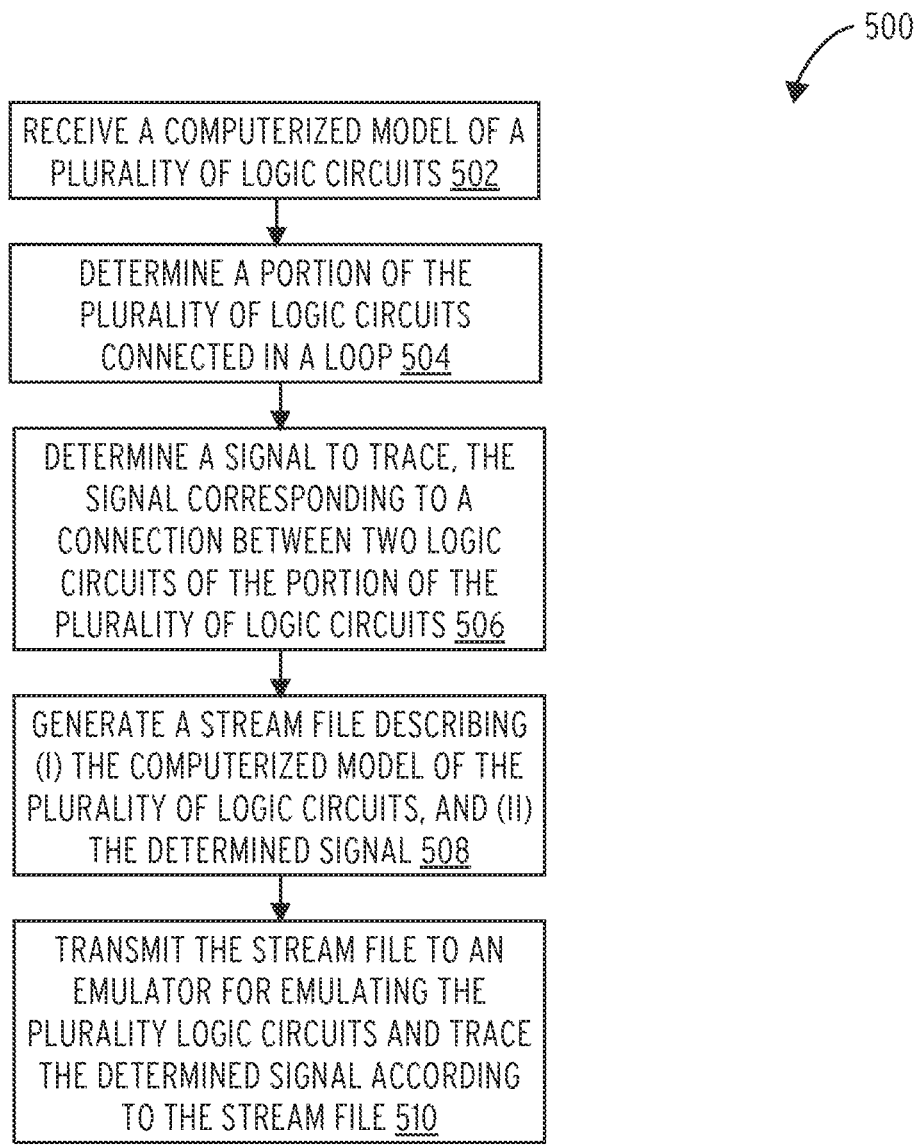
FIG. 5 illustrates an example embodiment of a loop breaking process 500.

The combination loop 300 may be processed in accordance with FIG. 5.

Figure 4:
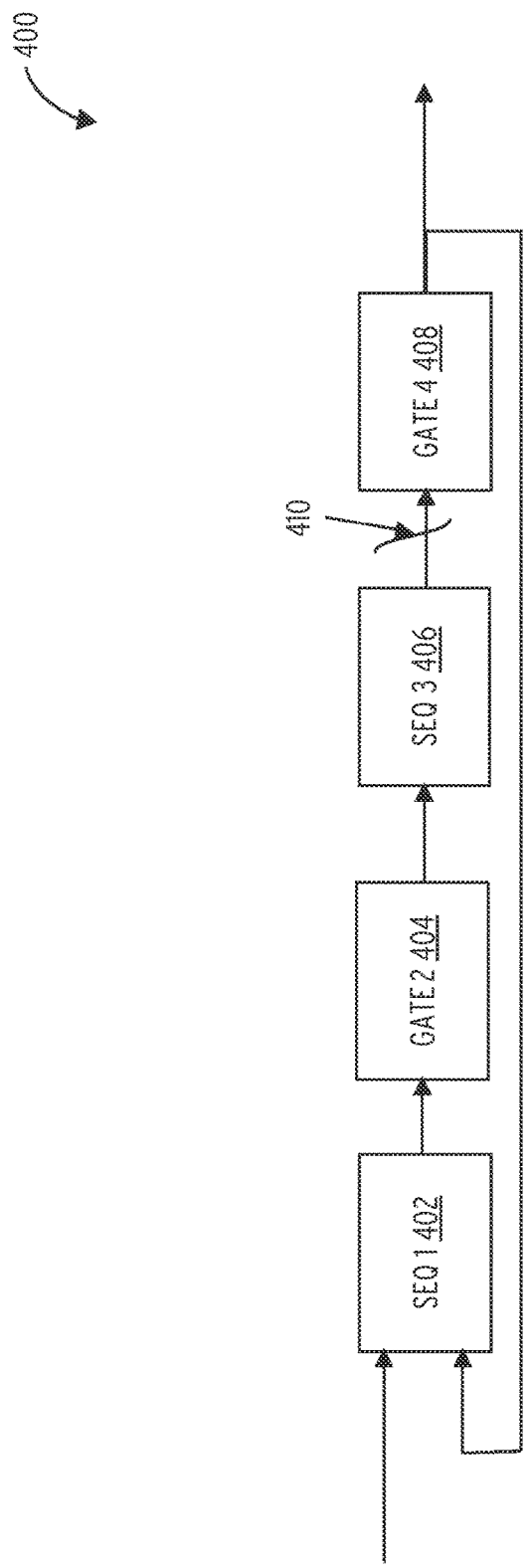
FIG. 4 illustrates an example embodiment of a sequential loop 400.

Feedback loops containing sequential elements, such as the loop shown in FIG. 4, are also broken in the embodiments described herein if the sequential elements are not dumped during the emulation run.

Referring to FIG. 4, a sequential loop 400 comprises a first gate 402, a second gate 404, a third gate 406, a fourth gate 408, and a loop break 410. Gates 402-408 are examples of logic circuits.

A feedback loop comprising sequential elements may be broken if the sequential elements (e.g., the first gate 402, the second gate 404, the third gate 406, and the fourth gate 408) are not dumped during the emulation run. The sequential loop 400 may be processed in accordance with FIG. 5.

The combinational and sequential loops in the design may be identified at compile time. Identifying the loops allows the emulator to minimize the primary inputs captured for the entire design. This may result in one signal captured for each combinational loop and one signal captured for each loop with non-sampled sequential elements.

Efficient Multi-Processor Based Calculation

Figure 9:
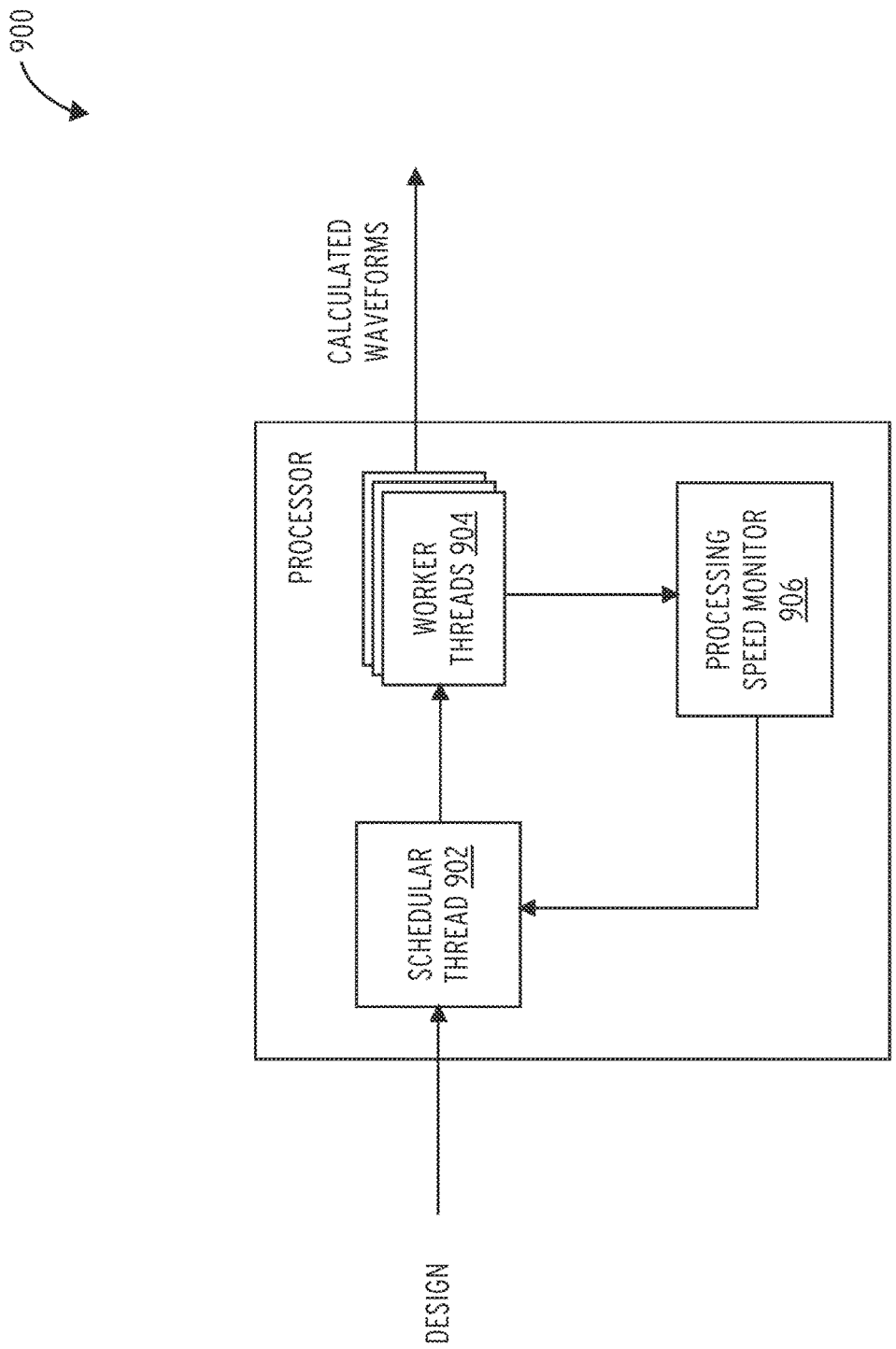
FIG. 9 illustrates an example embodiment of a multi-processor based calculation system 900.

A multi-core machine may be utilized to efficiently perform the waveform calculations, as each individual processor may evaluate a different piece of the design. A scheduler processing unit selects logic circuits that have known inputs and sends these to worker processing units for reconstruction. The load is balanced by monitoring the processing speed of each reconstruction processing unit and allocating new logic circuits to evaluate based on the current performance of the construction processing unit. FIG. 9, described below, shows a block diagram of a processor that uses a scheduler processing unit and a processing speed monitor to balance the waveform calculation load between a set of worker processing units.

Power activity in Switching Activity Interchange Format (SAIF) format includes the number of toggles for each signal, and the number of cycles that the signal is each of high, low, or unknown. The SAIF format may not comprise the full waveform details.

The expansion tool may operate more efficiently as the resulting waveform is not required. Any intermediate waveforms calculated may be removed from memory after the SAIF counts are generated.

The design may be iterated over in an optimal manner, by processing nodes in order to minimize the waveform storage requirements.

In FIG. 2, one order of evaluation is the logic circuit 202, the logic circuit 204, the logic circuit 206, and the logic circuit 208, requiring that the signal 218 and the signal 224 are both in memory at the same time.

An optimal order is to process the logic circuit 204, then the logic circuit 208. Then, the signal 224 may be removed, or the memory utilized be reallocated. Next, the logic circuit 202 and the logic circuit 206 are processed. In this case, one signal is in the memory at any time.

The order of events may be dynamically scheduled to balance the number of logic circuits ready to evaluate and the number of signals currently in memory.

When the list of logic circuits with all inputs known (and ready to process) is low, selection of logic circuits with high fan-out may cause more logic circuits to be added to this list. This will order the event reconstruction to prevent starvation in the ready-to-evaluate queue.

When the list of logic circuits with all inputs known is high, and memory use is high, then selection of logic circuits with high fan-in may cause more logic circuits to be removed from the list, and the waveforms may be removed.

Exemplary methods for balancing the waveform calculation between processing units or processing units are described below with respect to FIGS. 10 and 11.

Back Trace Invalidation

Some gates have a control pin that determines the functionality of the gate, and how data is processed. For example, a MUX has a select line and a FLOP may have a clock-enable. AND or OR gates can also behave this way depending on the input values.

When evaluating a gate, if the control signal causes the input to be ignored then evaluation of this gate is simplified. The output of the gate does not change, and the input values for the non-control pins do not need to be evaluated.

For example in FIG. 2, the logic circuit 206 is a MUX and this has a select to choose the lower input for a specific time range. This means that the input signal 218 may not affect the output of the logic circuit 206.

Additional optimization can be performed by searching back through the logic connected to the signal 218 and marking this time range as invalid or not required. This may cause evaluation of the logic circuit 202 to be skipped during the time range.

This back-trace may occur throughout the fan-in cone of the logic, marking many nodes with various time-ranges where calculation may be skipped.

Analysis of the design to determine low-power structures is performed to identify the clock-gating and data-gating inside the design. These waveforms are evaluated first and potentially dumped during the emulation run to further increase reconstruction speed.

As an example, an AND gate has two input signals. If a first of the two input signals is known to have a value of 0 for time 0 through 10,000, and 1 from time 10,000 to 20,000, the emulator system can immediately determine that the output of the AND gate will be 0 during time 0 through 10,000, and there is no need to calculate the input of the second input signal. Further, the value of the AND gate during time 10,000 to 20,000 can be simplified to the value of the second input signal.

Figure 12:
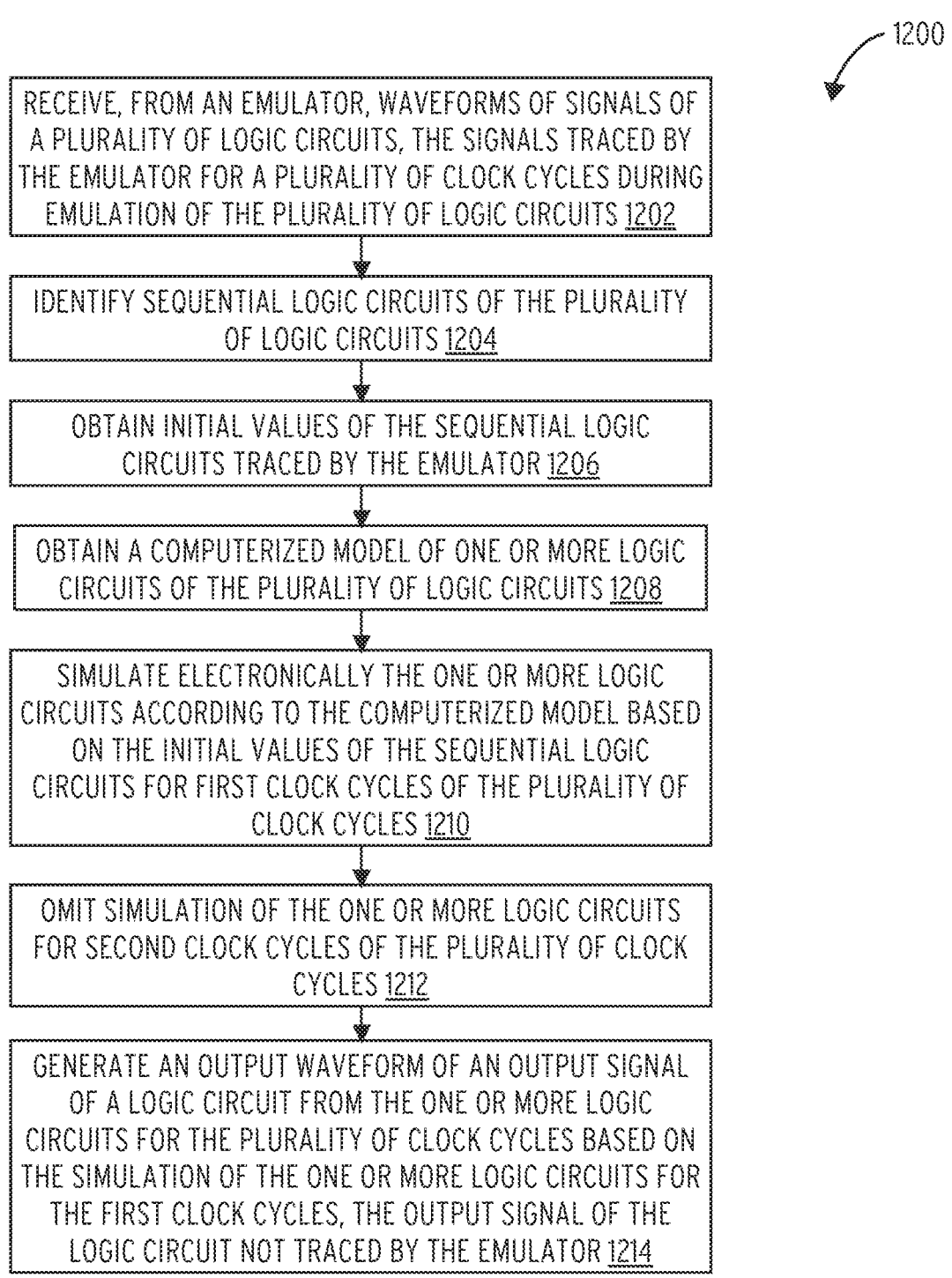
FIG. 12 illustrates an example embodiment of a back trace invalidation process 1200.

An exemplary method for back trace invalidation is described with respect to FIG. 12.

Calculation of a Time-Slice

To limit the amount of data captured during the emulation/FPGA run, a subset of the sequential elements in the design may be selected and captured (e.g., pipelined logic where the first stage of the pipeline is captured and subsequent stages are calculated during waveform reconstruction).

When this feature is utilized to capture a specific time range, the initial states of the sequential elements are utilized. Various techniques including scan chain logic may be utilized to obtain the sequential elements inside the design with limited additional hardware requirements.

Obtaining the combination of the sequential elements at the start of a time-capture window and then a subset of the sequential elements within the time-capture window may allow the full reconstruction of the sequential and the combinational elements.

For example, if the logic circuit in FIG. 2 are sequential flip-flops, and the logic circuit 202 and the logic circuit 204 are captured during the emulation execution, then the system may reconstruct signal 218 and signal 224 as the inputs are known. However, the system may not have the information to reconstruct the signal 226 or the signal 228 until the signals propagate to the logic circuit 206 and the logic circuit 208. This is further complicated if the logic circuit 206 and the logic circuit 208 have gated clocks, as this means the signal 226 or the signal 228 may not be known for a significant number of emulation time cycles.

Capturing the elements values at the start of the window may allow the initial state to be calculated for all elements in the design.

Figure 13:
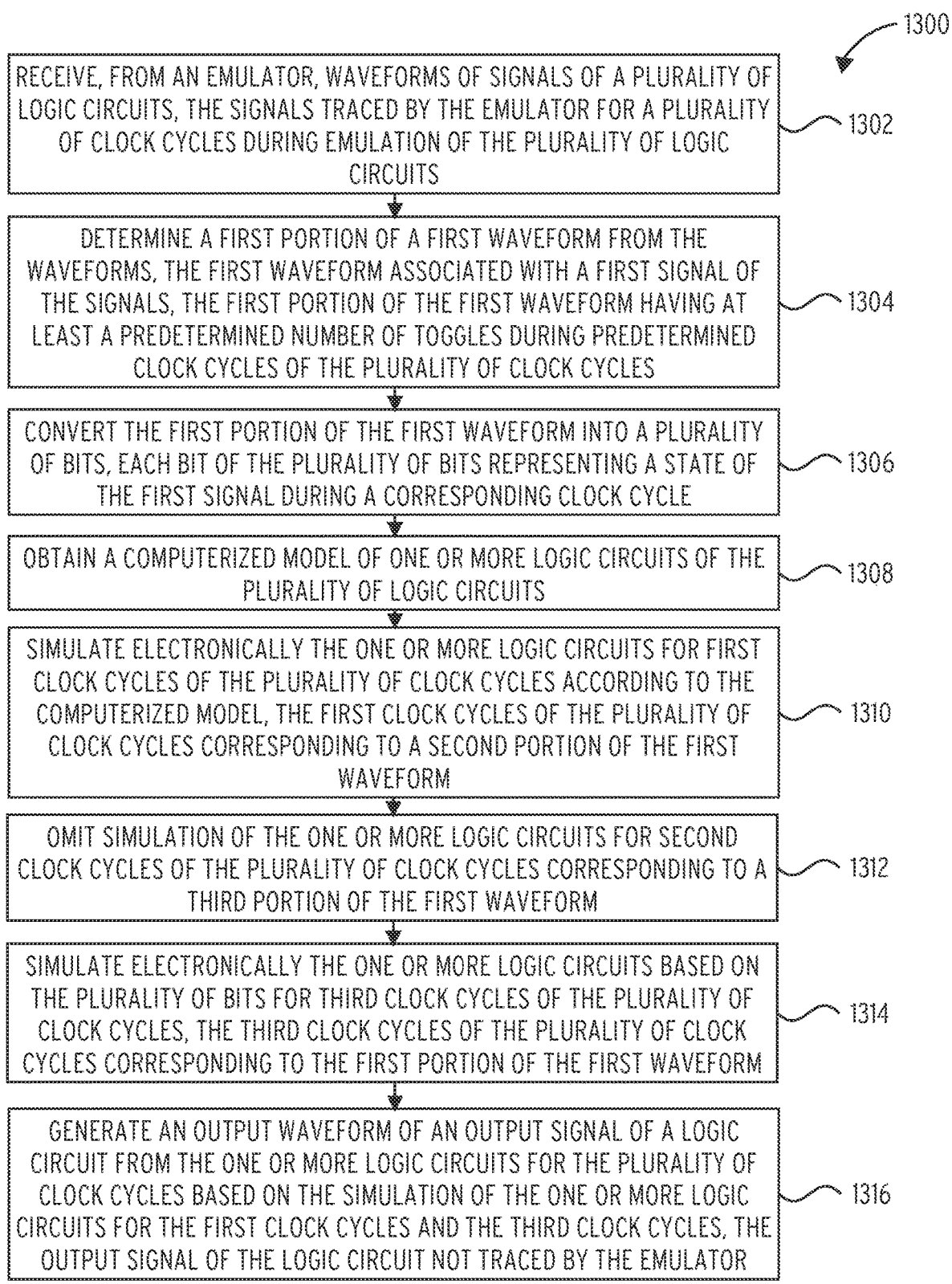
FIG. 13 illustrates an example embodiment of a time-slicing process 1300.

An exemplary time slicing process is described in greater detail with respect to FIG. 13.

Time Vectorization

Some signals in the design have a large number of events and calculating these complex events using traditional or waveform reconstruction techniques is inefficient. When the input data to an element exceeds a certain threshold, the input data pattern can be converted into a time-based bit-format. Simple operations can then be performed on the resulting bit vector as a single entity rather than on each individual bit.

Figure 6:
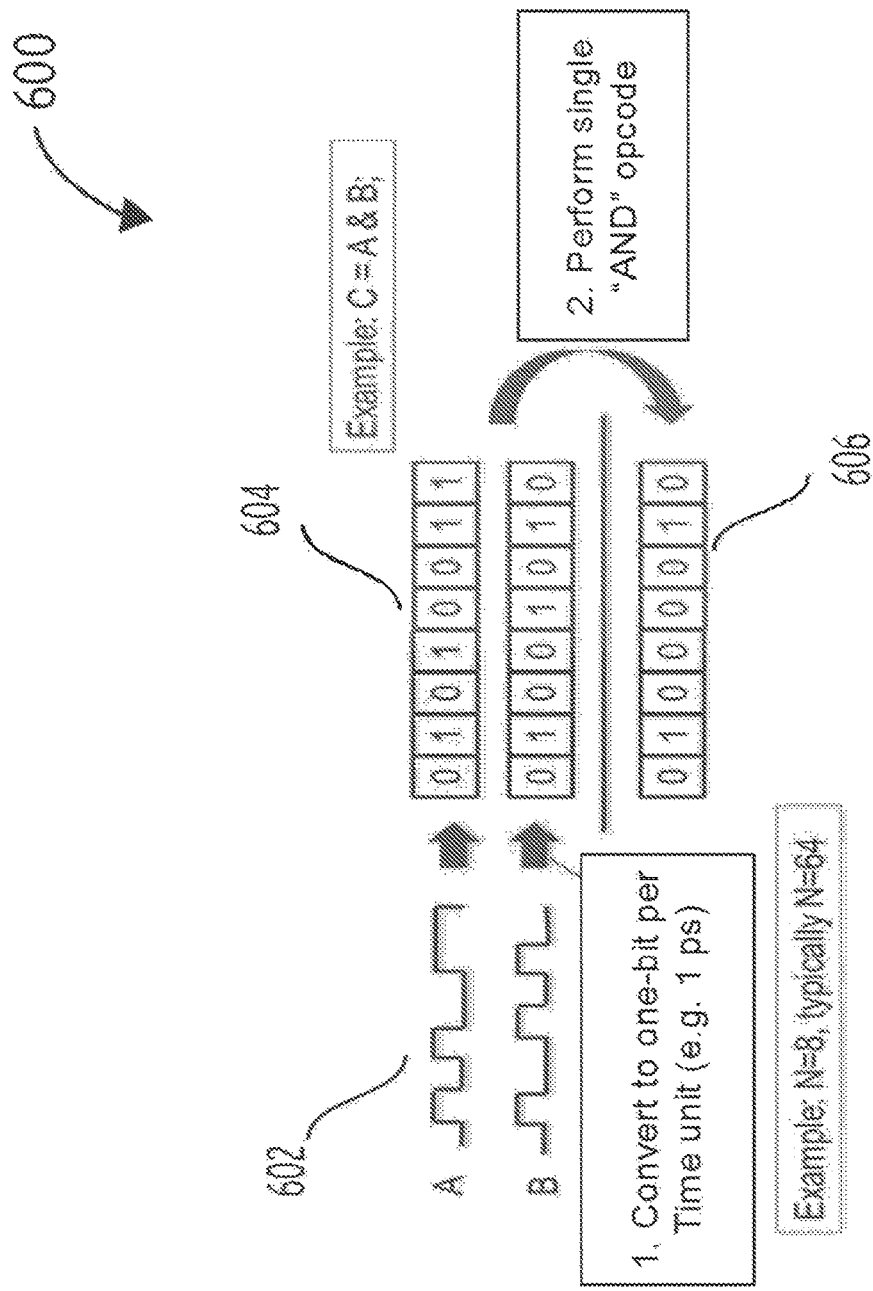
FIG. 6 illustrates an example embodiment of a waveform transformation 600.

For example, signal A and B have data values as shown in FIG. 6. The logic circuit is an AND gate, so the resulting waveform C will be a logical AND of A and B. Converting each of the A and B waveforms into a word-based format is shown in FIG. 6. The AND operation can then be performed on these elements, calculating N bits.

Without this conversion, a loop of many individual AND operations takes significantly longer to execute. In the example shown in FIG. 6, there are typically be 64 N calculations; the conversion reduces this number to 8. An exemplary time vectorization process is described in greater detail with respect to FIG. 14.

Data Dump Barriers

Conventional data dump from hardware includes buffers built into the hardware. These buffers allow the hardware to send larger data sections to the host when the buffer is full. This means that data arrives at the host in bursts and not in correct time order.

To address issues associated with conventional data dumps (e.g., transfers that do not correspond to incrementing time segments), processing tools may have to read the entire data dump to search for data that could be present for a specific signal. To read the signal values for a specific signal, the entire dump data file may be processed, as another set of values may be present later in the data file.

Figure 7:
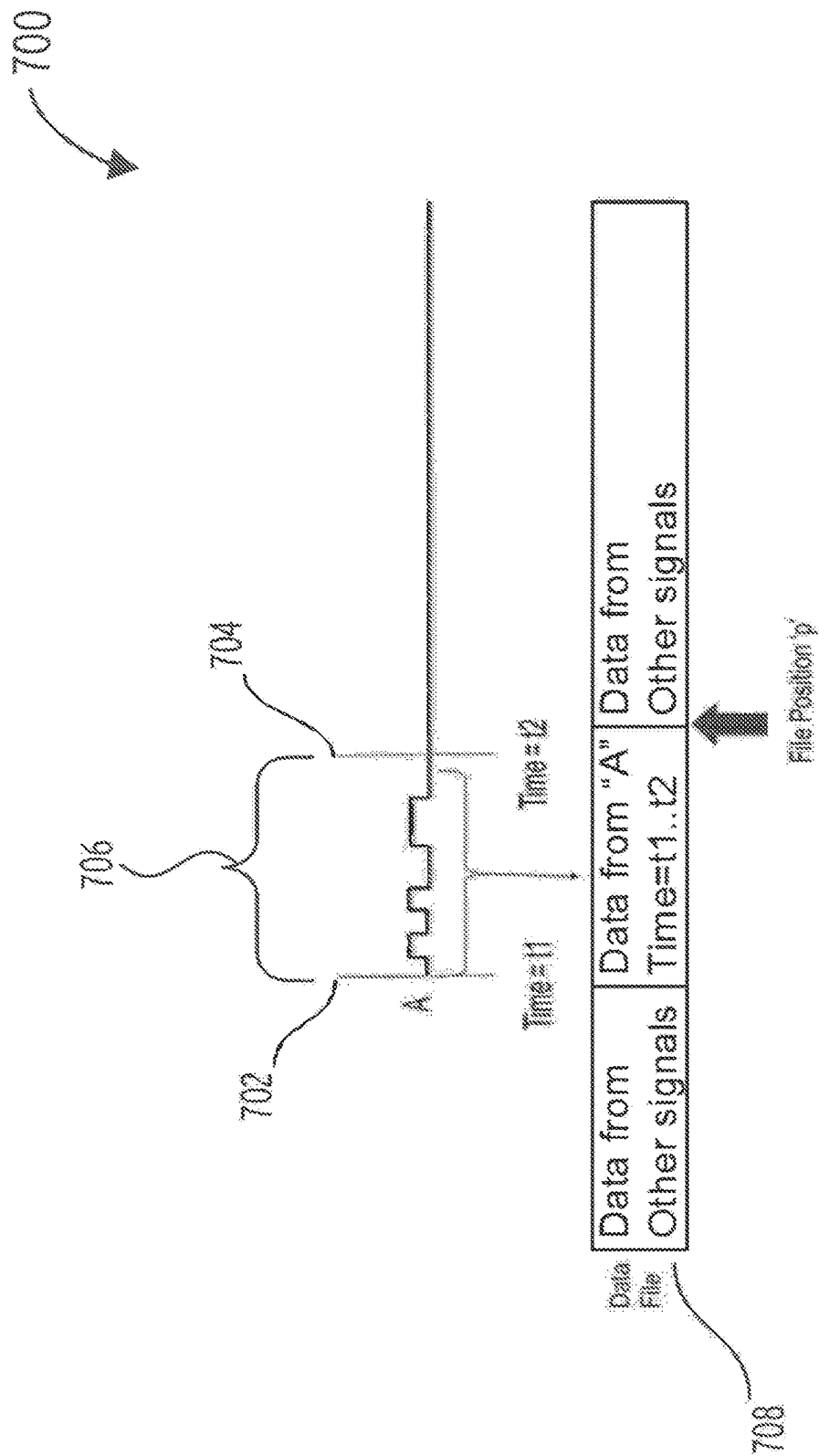
FIG. 7 illustrates an example embodiment of a signal 700.

In the example shown in FIG. 7, the waveform "A" in FIG. 7 is saved to a file. When the file is read at position "p", all events for waveform "A" are known. However, the tool cannot guarantee that there are no additional data sections for waveform "A" later in the file. So the entire file may be read to check for any additional waveform "A" sections.

Figure 8:
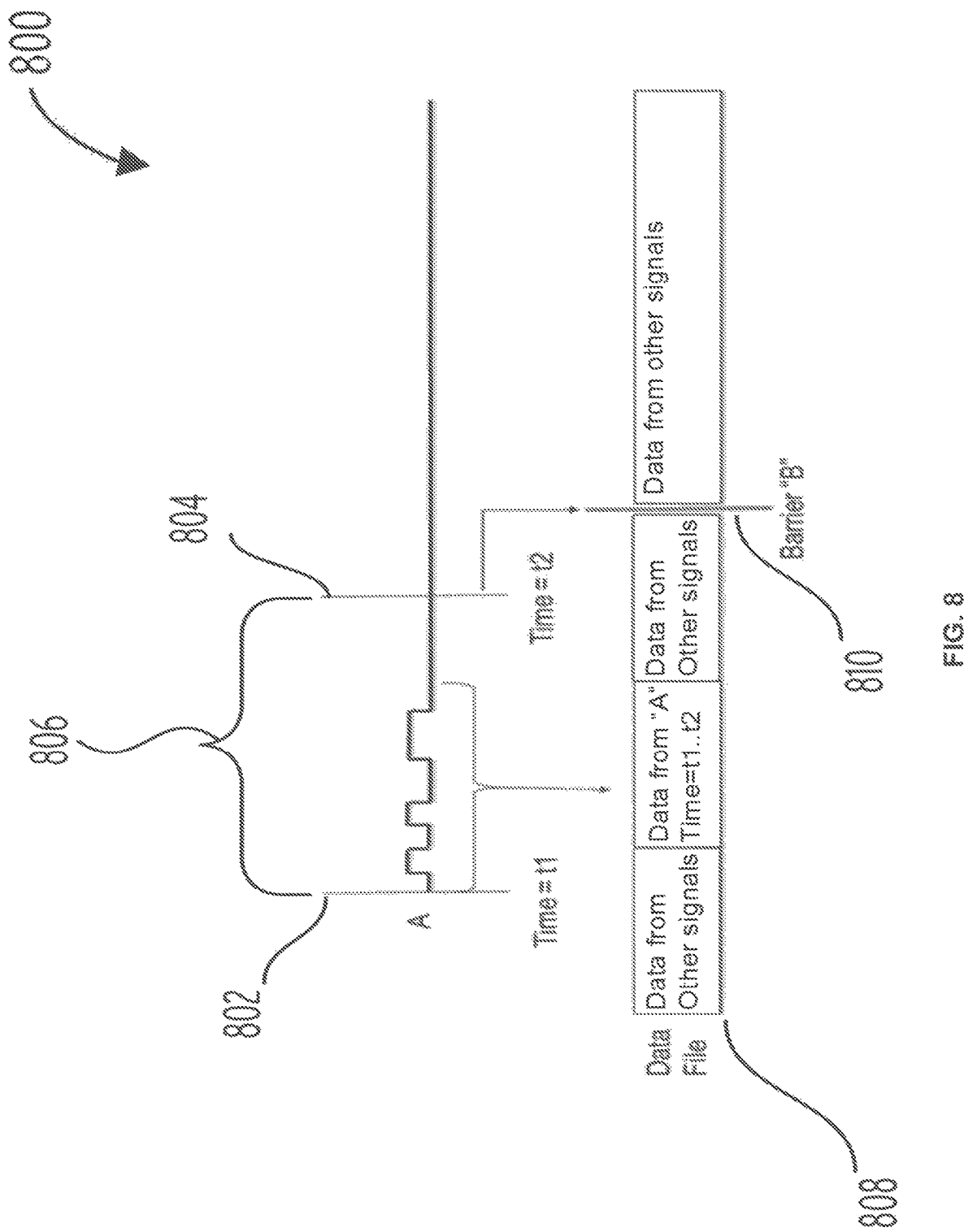
FIG. 8 illustrates an example embodiment of a signal 800.

To address this issue, the emulator can force the hardware to flush all data-buffers and add a data-dump barrier into the dumped data file, which will allow the post-processing tools to slice the input data at these buffer boundaries. The tools reading the data are now able to process t1..t2 without having to read past the barrier "B" location in the file, as shown in FIG. 8. This may reduce memory as the entire data-file is not read into memory or read multiple times.

The result of the data-barriers is a reduced memory requirement for the processing tools. In particular, the processing tools do not need to read the entire data-file into memory or read it multiple times, and instead can process each time segment from 0..Barrier-B as a segment. An exemplary data-dump barrier process is described with respect to FIG. 15.

FIG. 1 is an exemplary high-level block diagram of a hardware verification system 100, in accordance with one embodiment of the present invention. The hardware verification system 100 may be used to verify, test or debug a circuit design 104. The hardware verification system 100 may include a hardware emulator or prototype system 108 and a computer system 102, an embodiment of which is described in reference to FIG. 16. As depicted in FIG. 1, the hardware emulator or prototype system 108 may be coupled to the computer system 102, which may include a compiler 106 module that may receive a hardware description language representation of the circuit design 104.

The compiler 106 may include a multitude of various software modules that may or may not include a dedicated compiler module. The compiler 106 may transform, change, reconfigure, add new functions to, and/or control the timing of the circuit design 104 to facilitate verification, emulation, or prototyping of the circuit design 104. Further, the compiler 106 may compile the circuit design 104 and any associated changes into a binary image used to program the hardware emulator or prototype system 108.

Thus the logical functions and timing of the circuit design 104 that may ultimately be implemented by hardware in an integrated circuit chip may instead be first implemented in the hardware emulator or prototype system 108. Among other advantages, verification of the circuit design 104 in hardware may be accomplished at much higher speed than by software verification alone.

The hardware emulator or prototype system 108 may include a multitude of emulator units (e.g., unit 116, unit 118, unit 120) each comprising one or more circuit boards (e.g., board 110, board 112, board 114). Each board may comprise one or more programmable processors 122, such a Field Programmable Gate Arrays (FPGAs), and other blocks (not shown), such as memories, input/output devices, other processors, and the like. The hardware emulator or prototype system 108 receives a compiled circuit design 104 from the compiler 106, and programs the programmable processors 122 to verify behavior of the circuit design. The hardware emulator or prototype system 108 may include a primary or master system clock from which a number of other clock signals may be generated.

Referring to FIG. 5, a loop breaking process 500 receives a computerized model of a plurality of logic circuits (block 502). A portion of the plurality of logic circuits connected in a loop is determined (block 504). A signal is determined to be traced (block 506). The signal may correspond to a connection between two logic circuits of the portion of the plurality of logic circuits. A file is generated (block 508). The file may describe (i) the computerized model of the plurality of logic circuits, and (ii) the determined signal. The file is transmitted to an emulator for emulating the plurality logic circuits and trace the determined signal according to the file (block 510).

To determine the portion of the plurality of logic circuits connected in a loop, the compiler 106 may traverse the logic circuits of the circuit design 104. In an embodiment, the compiler 106 selects a logic circuit of the plurality of logic circuits and then determines whether a first flag or a second flag is associated with the logic circuit. The first flag indicates the logic circuit has been already examined, and the second flag indicates the logic circuit has not been examined. If the compiler 106 determines that the logic circuit is associated with the first flag, the compiler 106 associates a third flag to the logic circuit; the third flag indicates that the logic circuit is a circuit in the portion of the plurality of logic circuits connected in the loop. If the compiler 106 determines that the logic circuit is associated with the second flag, the compiler 106 associates the first flag to the logic circuit. After associating the new flag with the logic circuit, the compiler 106 selects a subsequent logic circuit of the plurality of logic circuits having an input coupled to an output of the previously-examined logic circuit.

In some embodiments, the compiler 106 determines a minimum number of signals to trace from signals corresponding to connections among the portion of the plurality of logic circuits. In such embodiments, the file further describes the determined minimum number of signals to trace.

In some embodiments, the compiler 106 determines multiple portion of the plurality of logic circuits connected in different loops. If the one loop encompasses another loop, the two loops may be combined into a larger loop.

In some embodiments, the computer 102 receives, from the emulator 108, a waveform of the determined signal traced by the emulator for a plurality of clock cycles during emulation of the portion of the plurality of logic circuits. The computer 102 then may simulate the portion of the plurality of logic circuits for a first set of clock cycles of the plurality of clock cycles based on the computerized model, while omitting simulation of the portion of the plurality of logic circuits for a second set of clock cycles of the plurality of clock cycles. The computer 102 may generate an output waveform of an output signal of a logic circuit from the portion of the plurality of logic circuits for the plurality of clock cycles based on the simulation of the portion of the plurality of logic circuits for the first set of clock cycles. This output signal of the logic circuit was not traced by the emulator 108.

In some embodiments, generating the output waveform of the output signal of the logic circuit for the plurality of clock cycles involves detecting a periodic pattern in an input waveform of an input signal of the logic circuit for the first set of clock cycles, determining a number of times the periodic pattern is repeated in the input waveform of the input signal for the first set of clock cycles, and generating the output waveform of the output signal of the logic circuit for the plurality of clock cycles based on the periodic pattern and the number of times the periodic pattern is repeated.

In some cases, the input signal of the logic circuit is traced by the emulator or is an output signal of another logic circuit.

In some embodiments, generating the output waveform of the output signal of the logic circuit for the plurality of clock cycles involves generating the output waveform of the output signal of the logic circuit for the second set of clock cycles to be in a predetermined state.

The computer 102 may be further configured to determine a signal to be used as a reference signal of the logic circuit, determine the first set of clock cycles of the plurality of clock cycles at which the reference signal is in a first state, and determine the second set of clock cycles of the plurality of clock cycles at which the reference signal is in a second state different from the first state. Determining the signal to be used as the reference signal of the logic circuit may involve selecting a first input signal of the logic circuit and selecting a second input signal that has a fewer number of periodic patterns than the first input signal to be the reference signal. The reference signal may be coupled to a predetermined port of the logic circuit.

Referring to FIG. 6, a waveform transformation 600 comprises an input waveform 602, a time vector 604, and a resultant time vector 606.

One or more input waveform 602 may be received. The input waveform 602 may be transformed into one or more time vector 604. This may be performed in accordance with FIG. 14.

The one or more time vector 604 may be transformed into the resultant time vector 606. Operations include logic operations, such as AND, OR, etc.

Referring to FIG. 7, a signal 700 comprises a first time 702, a second time 704, a time period 706, and a dumped data file 708.

The first time 702 and the second time 704 may be utilized to determine the time period 706. The time period 706 may be converted into part of the dumped data file 708.

Figure 15:
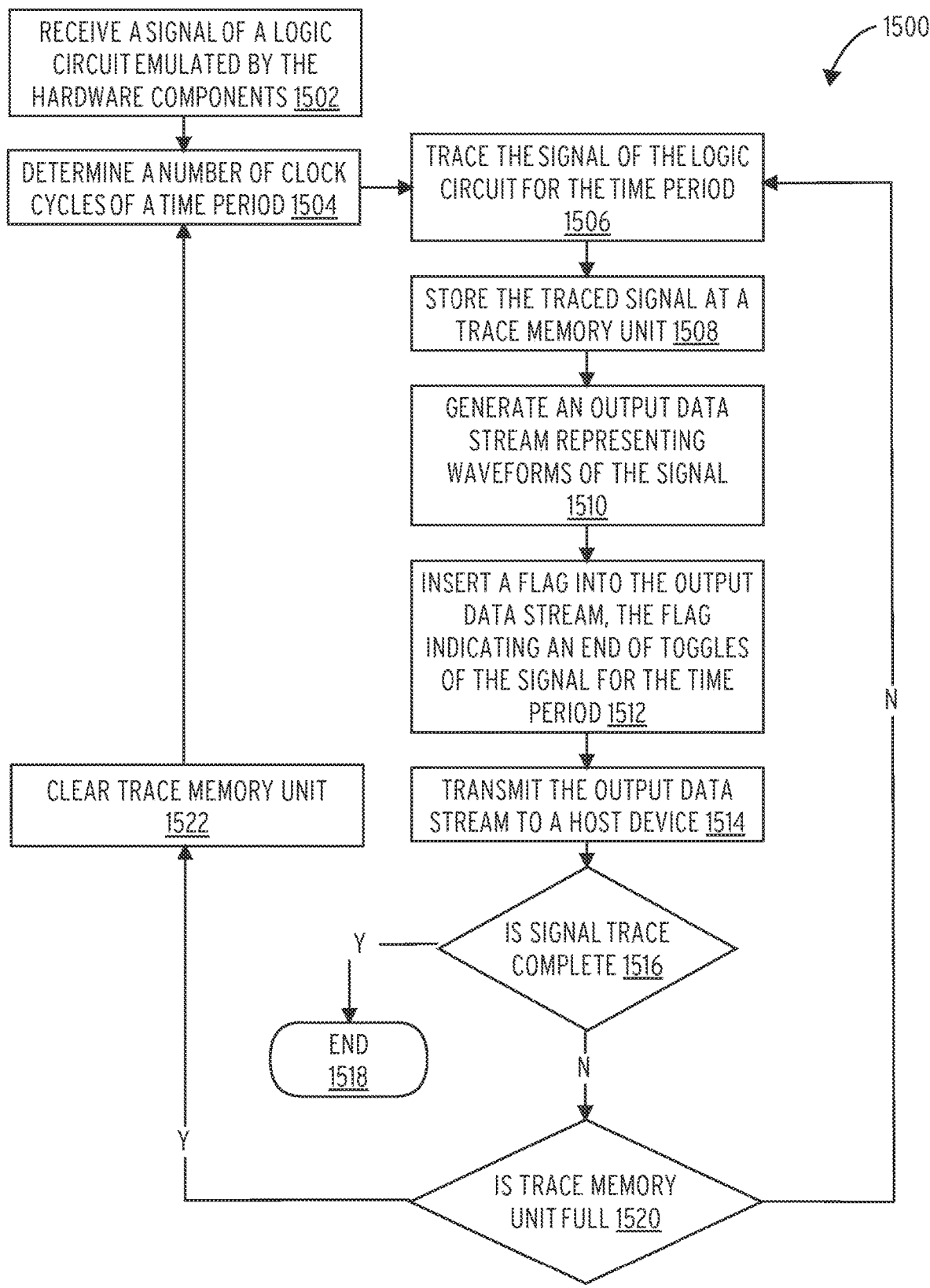
FIG. 15 illustrates an example embodiment of a data-dump barrier process 1500.

The signal 700 may be traced in accordance with FIG. 15.

Referring to FIG. 8, a signal 800 comprises a first time 802, a second time 804, a time period 806, and a dumped data file 808.

The first time 802 and the second time 804 may be utilized to determine the time period 806. The time period 806 may be converted into part of the dumped data file 808.

The flag 810 (e.g., barrier) may be added to the dumped data file 808. The flag 810 may be utilized to determine a barrier between each time period 806 converted. The flag 810 may also be utilized to signify that the portion of the dumped data file 808 results from the signal 800.

The signal 800 may be traced in accordance with FIG. 15.

Referring to FIG. 9, a multi-processor based calculation system 900 may comprise a scheduler processing unit 902, worker processing units 904, and a processing speed monitor 906.

The scheduler processing unit 902 may receive a design and send portion of the design (e.g., gates or other logic circuits) to the worker processing units 904 for the waveforms of the portion to be calculated. The scheduler processing unit 902 may also receive processing speed information for each of the worker processing units 904 from the processing speed monitor 906.

The worker processing units 904 may receive a portion of the design (e.g., gates or other logic circuits) and may calculate the waveforms of those portions.

The processing speed monitor 906 may monitor the performance of the worker processing units 904, including the processing speed. The processing speed monitor 906 may send the performance information to the scheduler processing unit 902.

Figure 10:
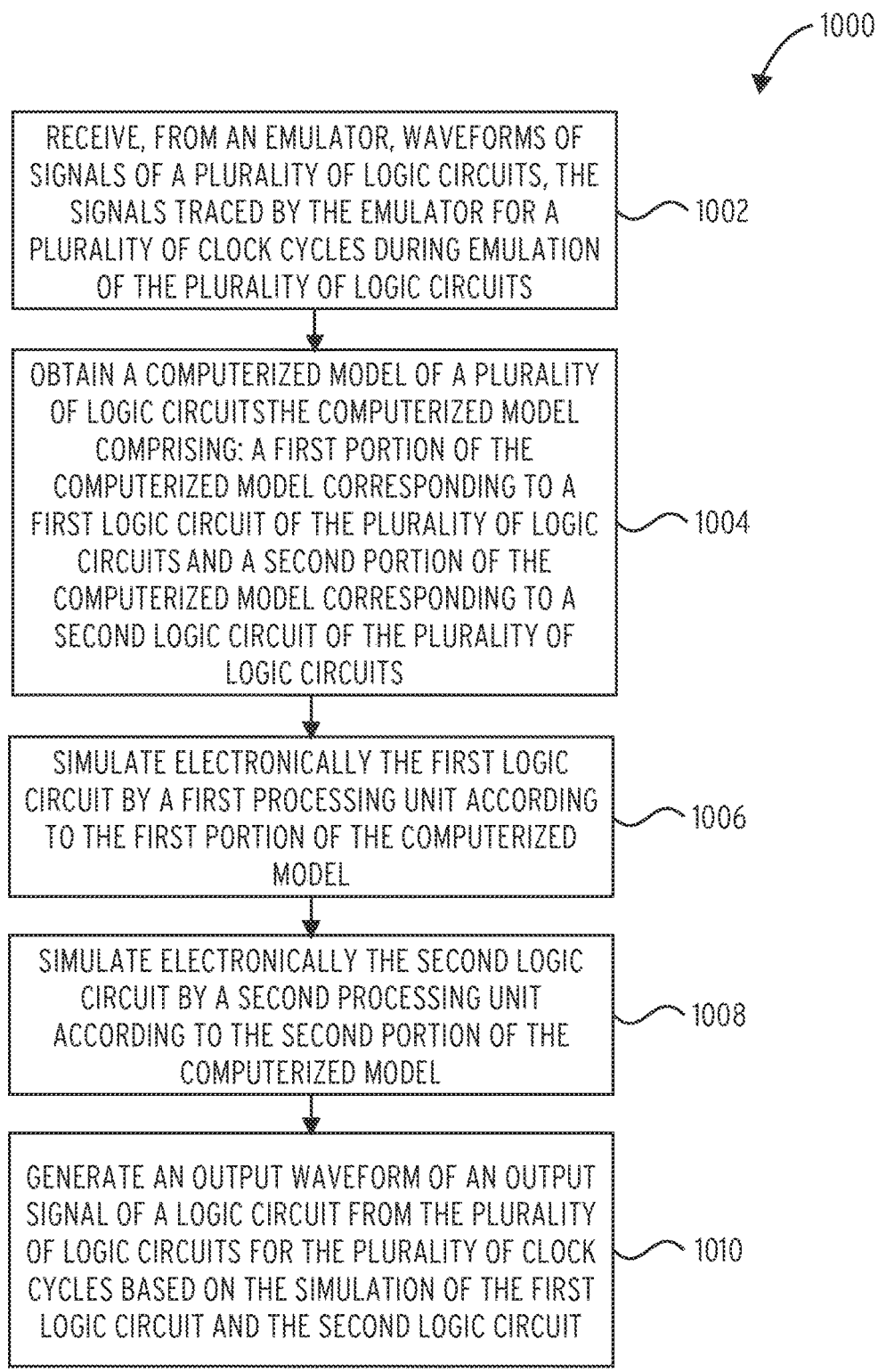
FIG. 10 illustrates an example embodiment of a multi-processor based calculation process 1000.
Figure 11:
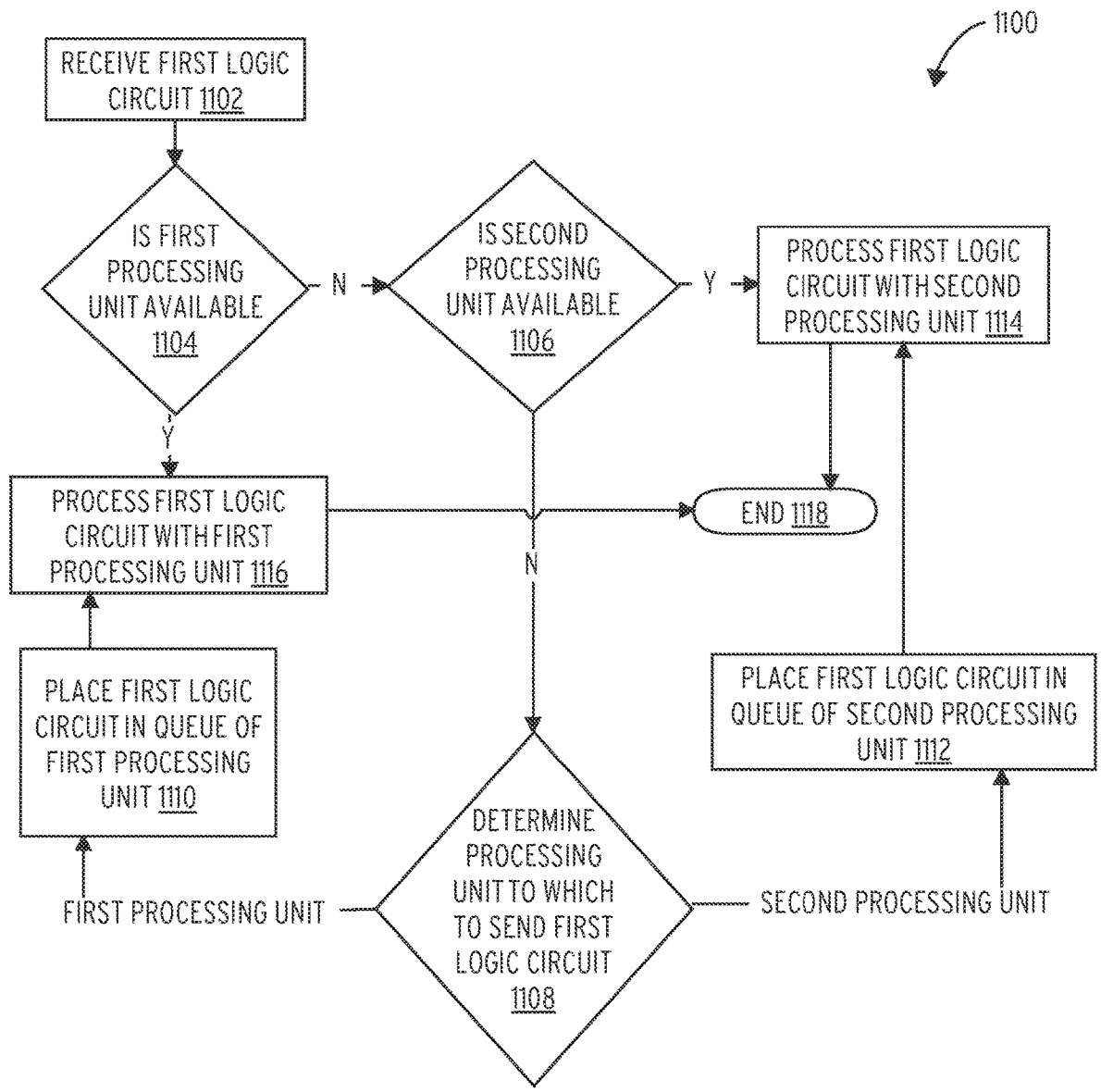
FIG. 11 illustrates an example embodiment of a multi-processor based calculation process 1100.

The multi-processor based calculation system 900 may be operated in accordance with FIG. 10 and FIG. 11.

Referring to FIG. 10, a multi-processor based calculation process 1000 receives, from an emulator, waveforms of signals of a plurality of logic circuits, the signals traced by the emulator for a plurality of clock cycles during emulation of the plurality of logic circuits (block 1002). A computerized model, comprising a first portion of the computerized model corresponding to at least a first logic circuit of the plurality of logic circuits and a second portion of the computerized model corresponding to at least a second logic circuit of the plurality of logic circuits of a plurality of logic circuits, is obtained (block 1004). For example, the model may be received at a scheduler processing unit 902 of a processor. The first logic circuit is simulated electronically by a first processing unit using the first portion of the computerized model (block 1006). The second logic circuit is simulated electronically by a second processing unit using the second portion of the computerized model (block 1008). An output waveform of an output signal of a logic circuit from the plurality of logic circuits for the plurality of clock cycles is generated based on the simulation of the first logic circuit and the second logic circuit (block 1010). These simulations may be performed and the output waveform output by the worker processing units 904.

In some embodiments, the multi-processor based calculation process 1000 further determines an available one of the first processing unit and the second processing unit (e.g., a first and second worker processing unit on a processor), wherein the instructions further comprise instructions to simulate the first logic circuit, responsive to a determination that the first processing unit is available.

In some embodiments, the multi-processor based calculation process 1000 further causes the first processing unit to simulate a third logic circuit of the plurality of logic circuits, after the first processing unit completes the simulation of the first logic circuit while the second processing unit simulates the second logic circuit.

Referring to FIG. 11, the multi-processor based calculation process 1100 receives a first logic circuit (block 1102). The availability of a first processing unit is determined (decision block 1104). If the first processing unit is not available, the availability of a second processing unit is determined (decision block 1106). The availabilities may be determined by a scheduler processing unit 902. If the second processing unit is not available, the processor to which to send the first logic circuit is determined, e.g., by the scheduler processing unit 902 (decision block 1108). Decision 1108 may be based on the processing speeds provided by the processing speed monitor 906 or other information.

If the first processing unit is determined at 1108, the first logic circuit is placed in the queue of the first processing unit (block 1110). If the first processing unit is available at 1104 or the first logic circuit is at the front of the queue of the first processing unit, the first processing unit processes the first logic circuit (block 1116).

If the second processing unit is determined at 1108, the first logic circuit is placed in the queue of the second processing unit (block 1112). If the second processing unit is available at 1106 or first logic circuit is at the front of the queue of the second processing queue, the second processing unit processes the first logic circuit (block 1114).

After the first logic circuit is processed by the first processing unit (block 1116) or the second processing unit (block 1114), the multi-processor based calculation process 1100 ends (block 1118).

In some embodiments, the first logic circuit may remain in the queue of either the first processing unit or the second processing unit until the first logic circuit is at the head or front of the queue (e.g., first in, first out).

In some embodiments, the decision block 1108 is determined by the current performance (e.g., processing speed) of the first processing unit and the second processing unit.

Referring to FIG. 12, a back trace invalidation process 1200 receives, from an emulator, waveforms of signals of a plurality of logic circuits, the signals traced by the emulator for a plurality of clock cycles during emulation of the plurality of logic circuits (block 1202). A set of one or more sequential logic circuits of the plurality of logic circuits are identified (block 1204). One or more initial values of the set of sequential logic circuits traced by the emulator are obtained (block 1206). A computerized model of one or more logic circuits of the plurality of logic circuits is obtained (block 1208). The one or more logic circuits according to the computerized model are simulated electronically based on the initial values of the sequential logic circuits for first clock cycles of the plurality of clock cycles (block 1210). The simulation of the one or more logic circuits for second clock cycles of the plurality of clock cycles is omitted (block 1212). An output waveform of an output signal of a logic circuit from the one or more logic circuits for the plurality of clock cycles is generated based on the simulation of the one or more logic circuits for the first clock cycles, the output signal of the logic circuit not traced by the emulator (block 1214).

The one or more of the sequential logic circuits may not be traced after the initial values are traced.

In some embodiments, the back trace invalidation process 1200 may further detect a periodic pattern in an input waveform of an input signal of the logic circuit for the first clock cycles, determine a number of periodic patterns repeated in the input waveform of the input signal for the first clock cycles, and generate the output waveform of the output signal of the logic circuit for the plurality of clock cycles based on the periodic pattern and the number of the periodic patterns repeated. The back trace invalidation process 1200 may further generate the output waveform of the output signal of the logic circuit for the second clock cycles to be in a predetermined state.

In some embodiments, the back trace invalidation process 1200 may further determine a signal to be used as a reference signal of the logic circuit, determine the first clock cycles of the plurality of clock cycles at which the reference signal is in a first state, and determine the second clock cycles of the plurality of clock cycles at which the reference signal is in a second state different from the first state.

The back trace invalidation process 1200 may occur throughout a fan-in cone of the logic and multiple nodes may be marked with various time-ranges where calculation may be skipped.

Analysis of the design to determine low-power structures may be performed to identify the clock-gating and data-gating inside the design. The waveforms for the identified clock-gating and data-gating may be evaluated first and may be dumped during the emulation run to further increase reconstruction speed.

Referring to FIG. 13, one time-slicing process 1300 receives, from an emulator, waveforms of signals of a plurality of logic circuits, the signals traced by the emulator for a plurality of clock cycles during emulation of the plurality of logic circuits (block 1302). A first portion of a first waveform is determined from the waveforms, the first waveform associated with a first signal of the signals, the first portion of the first waveform having at least a predetermined number of toggles during predetermined clock cycles of the plurality of clock cycles (block 1304). The first portion of the first waveform is converted into a plurality of bits, each bit of the plurality of bits representing a state of the first signal during a corresponding clock cycle (block 1306). A computerized model of one or more logic circuits of the plurality of logic circuits is obtained (block 1308). The one or more logic circuits for first clock cycles of the plurality of clock cycles is simulated electronically according to the computerized model, the first clock cycles of the plurality of clock cycles corresponding to a second portion of the first waveform (block 1310). The simulation of the one or more logic circuits for second clock cycles of the plurality of clock cycles corresponding to a third portion of the first waveform is omitted (block 1312). The one or more logic circuits is simulated electronically based on the plurality of bits for third clock cycles of the plurality of clock cycles, the third clock cycles of the plurality of clock cycles corresponding to the first portion of the first waveform (block 1314). An output waveform of an output signal of a logic circuit is generated from the one or more logic circuits for the plurality of clock cycles based on the simulation of the one or more logic circuits for the first clock cycles and the third clock cycles, the output signal of the logic circuit not traced by the emulator (block 1316).

The time-slicing process 1300 may further obtain a portion of the output signal corresponding to the third clock cycles through a single opcode based on the plurality of bits.

The time-slicing process 1300 may further detect a periodic pattern in an input waveform of an input signal of the logic circuit for the first clock cycles, determine a number of periodic patterns repeated in the input waveform of the input signal for the first clock cycles, and generate the output waveform of the output signal of the logic circuit for the plurality of clock cycles based on the periodic pattern and the number of the periodic patterns repeated. In some embodiments, the output waveform of the output signal of the logic circuit for the second clock cycles is generated to be in a predetermined state.

The time-slicing process 1300 may further determine a signal to be used as a reference signal of the logic circuit, determine the first clock cycles of the plurality of clock cycles at which the reference signal is in a first state, and determine the second clock cycles of the plurality of clock cycles at which the reference signal is in a second state different from the first state.

In some embodiments, the waveforms of the signals received from the emulator may be represented in switching activity interface format (SAIF). A waveform of a signal represented in the SAIF may describe a number of toggles of the signal, a number of clock cycles during which the signal is in a low state, and a number of clock cycles during which the signal is in a high state.

Techniques, including scan chain logic, may be utilized to obtain the sequential elements inside a design. These techniques may be performed with limited additional hardware requirements. Obtaining the combination of the sequential elements at the start of a time-capture window and then a subset of the sequential elements within the time-capture window may allow a reconstruction of the sequential and the combinational elements. Capturing the values of the elements at the start of a window may allow calculation of the initial state for the elements in the design.

Figure 14:
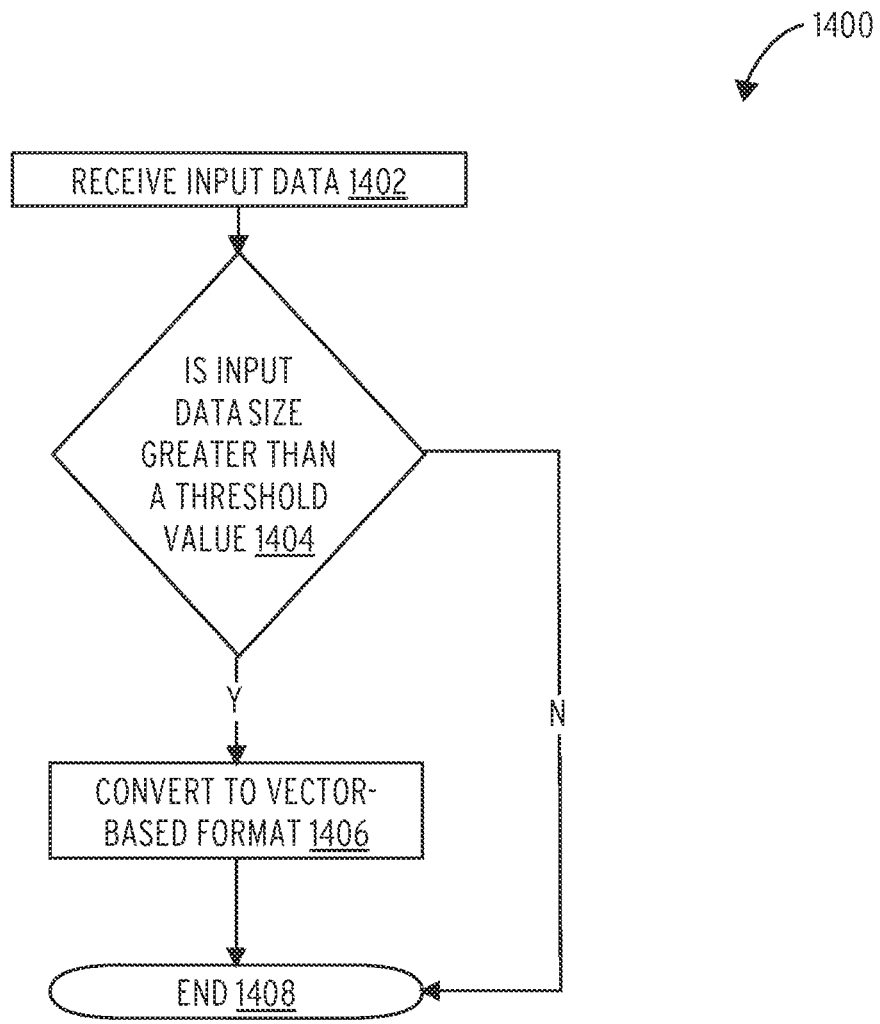
FIG. 14 illustrates an example embodiment of a time vectorization process 1400.

Referring to FIG. 14, a time vectorization process 1400 receives input data (block 1402). The input data may be a waveform. The size of the input data is compared to a threshold value (decision block 1404). The threshold value may be received from a memory structure or inputted to the system. The input data is converted to a vector-based format (block 1406). The vector-based format may be a word-based format. The time vectorization process 1400 ends if the input data is less than the threshold value or the input data is converted to a vector-based format (done block 1408).

Additional operations may be performed on the vector-based formatted data. The operation may include logical operations (e.g., AND, OR, etc.) and conversion to a waveform.

Referring to FIG. 15, a data-dump barrier process 1500 receives a signal of a logic circuit emulated by the hardware components (block 1502). A number of clock cycles is determined for a time period (block 1504). The signal of the logic circuit is traced for the time period (block 1506). The traced signal is stored in a trace memory unit (block 1508). An output data stream representing waveforms of the signal is generated (block 1510). A flag is inserted into the output data stream (block 1512). The flag may indicate an end of toggles of the signal for the time period. The output data stream is transmitted to a host device (block 1514). Whether the signal trace is complete is determined (decision block 1516). If the signal trace is complete, the data-dump barrier process 1500 ends (done block 1518).

If the signal trace is not complete, whether the trace memory unit is full is determined (decision block 1520). If the trace memory unit is full, the trace memory unit is cleared (block 1522) and a new time period is determined (block 1504). The time period traced (block 1506) may be a portion of the signal not previously traced. If the trace memory unit is not full, the signal of the logic circuit is traced for an additional time period of the same number of clock cycles (block 1506). The time period traced may be a portion of the signal not previously traced.

Figure 16:
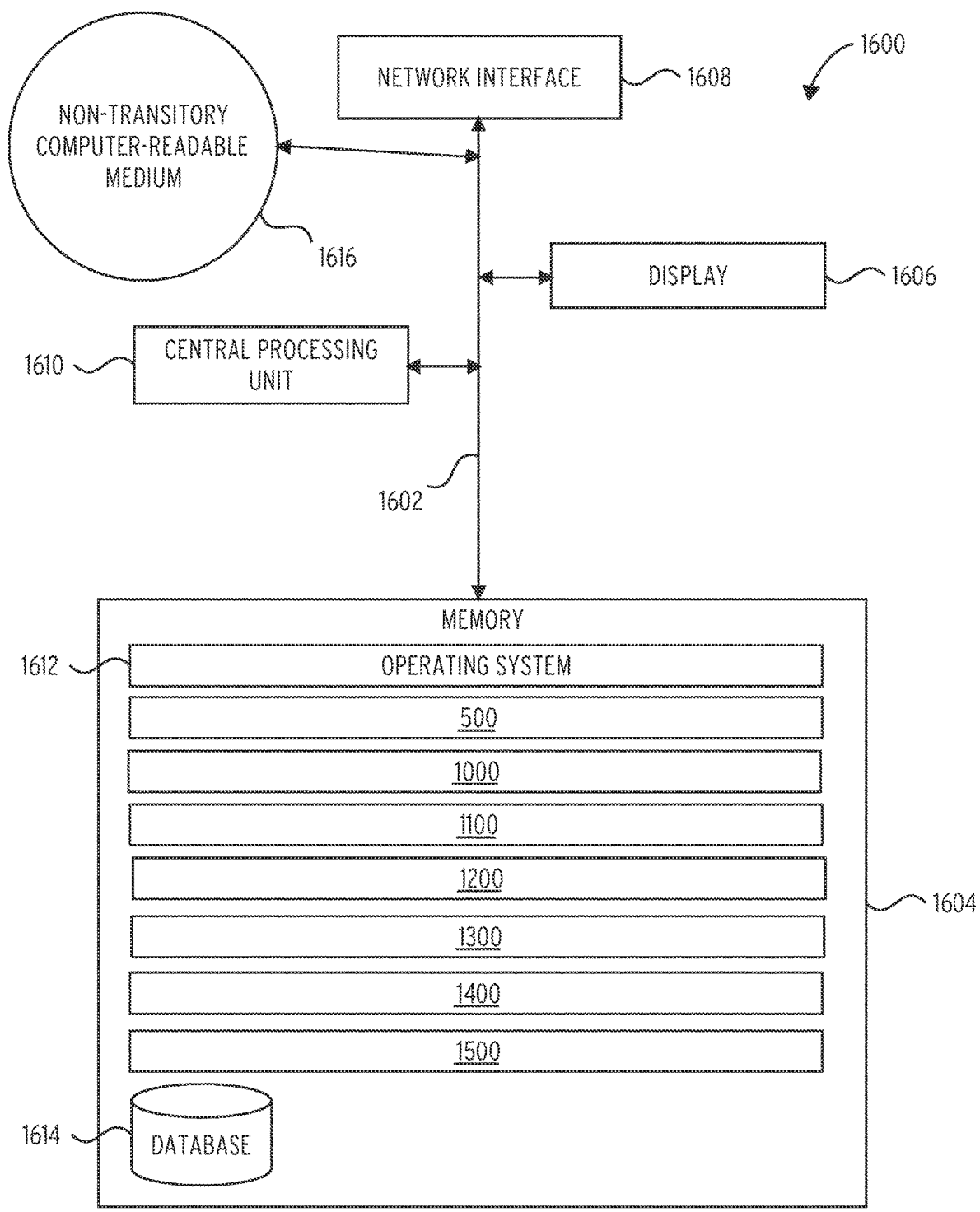
FIG. 16 illustrates an example system 1600 in accordance with one embodiment.

FIG. 16 illustrates several components of an exemplary system 1600 in accordance with one embodiment. In various embodiments, system 1600 may include a desktop PC, server, workstation, or other computing device that is capable of performing operations such as those described herein. In some embodiments, system 1600 may include many more components than those shown in FIG. 16. However, it is not necessary that all of these generally conventional components be shown in order to disclose an illustrative embodiment. Collectively, the various tangible components or a subset of the tangible components may be referred to herein as "logic" configured or adapted in a particular way, for example as logic configured or adapted with particular software or firmware.

In various embodiments, system 1600 may comprise one or more physical and/or logical devices that collectively provide the functionalities described herein. In some embodiments, system 1600 may comprise one or more replicated and/or distributed physical or logical devices.

In some embodiments, system 1600 may comprise one or more computing resources provisioned from a "cloud computing" provider, for example, Amazon Elastic Compute Cloud ("Amazon EC2"), provided by Amazon.com, Inc. of Seattle, Washington; Sun Cloud Compute Utility, provided by Sun Microsystems, Inc. of Santa Clara, California; Windows Azure, provided by Microsoft Corporation of Redmond, Washington, and the like.

System 1600 includes a bus 1602 interconnecting several components including a network interface 1608, a display 1606, a central processing unit 1610, and a memory 1604.

Memory 1604 generally comprises a random access memory ("RAM") and permanent non-transitory mass storage device, such as a hard disk drive or solid-state drive. Memory 1604 stores an operating system 1612.

These and other software components may be loaded into memory 1604 of system 1600 using a drive mechanism (not shown) associated with a non-transitory computer-readable medium 1616, such as a floppy disc, tape, DVD/CD-ROM drive, memory card, or the like.

Memory 1604 also includes database 1614. In some embodiments, system 1600 may communicate with database 1614 via network interface 1608, a storage area network ("SAN"), a high-speed serial bus, and/or via the other suitable communication technology.

In some embodiments, database 1614 may comprise one or more storage resources provisioned from a "cloud storage" provider, for example, Amazon Simple Storage Service ("Amazon S3"), provided by Amazon.com, Inc. of Seattle, Washington, Google Cloud Storage, provided by Google, Inc. of Mountain View, California, and the like.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. "logic" refers to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation. Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware. The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, flash drives, SD cards, solid state fixed or removable storage, and computer memory. In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment). Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

What is claimed is:

1. A non-transitory computer readable medium comprising stored instructions, the instructions that when executed by a processor cause the processor to:
   determine a first portion of a first waveform from waveforms of signals of a plurality of logic circuits, the first waveform associated with a first signal of the signals, the first portion of the first waveform having at least a predetermined number of toggles during predetermined clock cycles of a plurality of clock cycles during emulation of the plurality of logic circuits;
   convert the first portion of the first waveform into a plurality of bits, each bit of the plurality of bits representing a state of the first signal during a corresponding clock cycle;
   simulate electronically one or more logic circuits of the plurality of logic circuits for first clock cycles of the plurality of clock cycles, the first clock cycles of the plurality of clock cycles corresponding to a second portion of the first waveform;
   omit simulation of the one or more logic circuits for second clock cycles of the plurality of clock cycles corresponding to a third portion of the first waveform;
   simulate electronically the one or more logic circuits based on the plurality of bits for third clock cycles of the plurality of clock cycles, the third clock cycles of the plurality of clock cycles corresponding to the first portion of the first waveform; and
   generate an output waveform of an output signal of a logic circuit from the one or more logic circuits for the plurality of clock cycles based on the simulation of the one or more logic circuits for the first clock cycles and the third clock cycles.

2. The non-transitory computer readable medium of claim 1, wherein the instructions that cause the processor to simulate the one or more logic circuits based on the plurality of bits for the third clock cycles of the plurality of clock cycles further cause a processing unit to obtain a portion of the output signal corresponding to the third clock cycles through a single opcode based on the plurality of bits.

3. The non-transitory computer readable medium of claim 1, wherein the instructions to generate the output waveform of the output signal of the logic circuit for the plurality of clock cycles further comprise instructions that when executed cause the processor to:
   detect a periodic pattern in an input waveform of an input signal of the logic circuit for the first clock cycles;
   determine a number of periodic patterns repeated in the input waveform of the input signal for the first clock cycles; and
   generate the output waveform of the output signal of the logic circuit for the plurality of clock cycles based on the periodic pattern and the number of the periodic patterns repeated.

4. The non-transitory computer readable medium of claim 3, wherein the instructions to cause the processor to generate the output waveform of the output signal of the logic circuit for the plurality of clock cycles further comprise instructions that when executed cause the processor to:
   generate the output waveform of the output signal of the logic circuit for the second clock cycles to be in a predetermined state.

5. The non-transitory computer readable medium of claim 1, further comprising instructions that when executed by the processor cause the processor to:
   determine a signal to be used as a reference signal of the logic circuit;
   determine the first clock cycles of the plurality of clock cycles at which the reference signal is in a first state; and
   determine the second clock cycles of the plurality of clock cycles at which the reference signal is in a second state different from the first state.

6. The non-transitory computer readable medium of claim 1, wherein the waveforms of the signals are received from an emulator and are represented in switching activity interface format (SAIF), a waveform of a signal represented in the SAIF describing a number of toggles of the signal, a number of clock cycles during which the signal is in a low state, and a number of clock cycles during which the signal is in a high state.

7. The non-transitory computer readable medium of claim 1, further comprising instructions that when executed by the processor cause the processor to:
   receive, from an emulator, the waveforms of signals of the plurality of logic circuits, the signals traced by the emulator for the plurality of clock cycles during emulation of the plurality of logic circuits; and
   obtain a computerized model of one or more logic circuits of the plurality of logic circuits.

8. The non-transitory computer readable medium of claim 7, wherein, the output signal of the logic circuit is not traced by the emulator.

9. A method comprising:
   determining a first portion of a first waveform from waveforms of signals of a plurality of logic circuits, the first waveform associated with a first signal of the signals, the first portion of the first waveform having at least a predetermined number of toggles during predetermined clock cycles of a plurality of clock cycles during emulation of the plurality of logic circuits;

converting the first portion of the first waveform into a plurality of bits, each bit of the plurality of bits representing a state of the first signal during a corresponding clock cycle;

simulating electronically one or more logic circuits of the plurality of logic circuits for first clock cycles of the plurality of clock cycles, the first clock cycles of the plurality of clock cycles corresponding to a second portion of the first waveform;

omitting simulation of the one or more logic circuits for second clock cycles of the plurality of clock cycles corresponding to a third portion of the first waveform;

simulating electronically the one or more logic circuits based on the plurality of bits for third clock cycles of the plurality of clock cycles, the third clock cycles of the plurality of clock cycles corresponding to the first portion of the first waveform; and generating an output waveform of an output signal of a logic circuit from the one or more logic circuits for the plurality of clock cycles based on the simulation of the one or more logic circuits for the first clock cycles and the third clock cycles.

10. The method of claim 9, wherein simulating the one or more logic circuits based on the plurality of bits for the third clock cycles of the plurality of clock cycles comprises obtaining a portion of the output signal corresponding to the third clock cycles through a single opcode based on the plurality of bits.

11. The method of claim 9, wherein generating the output waveform of the output signal of the logic circuit for the plurality of clock cycles comprises:

detecting a periodic pattern in an input waveform of an input signal of the logic circuit for the first clock cycles;

determining a number of periodic patterns repeated in the input waveform of the input signal for the first clock cycles; and generating the output waveform of the output signal of the logic circuit for the plurality of clock cycles based on the periodic pattern and the number of the periodic patterns repeated.

12. The method of claim 11, wherein generating the output waveform of the output signal of the logic circuit for the plurality of clock cycles comprises:

generating the output waveform of the output signal of the logic circuit for the second clock cycles to be in a predetermined state.

13. The method of claim 9, further comprising:

determining a signal to be used as a reference signal of the logic circuit;

determining the first clock cycles of the plurality of clock cycles at which the reference signal is in a first state; and determining the second clock cycles of the plurality of clock cycles at which the reference signal is in a second state different from the first state.

14. The method of claim 9, wherein the waveforms of the signals received from the emulator are represented in switching activity interface format (SAIF), a waveform of a signal represented in the SAIF describing a number of toggles of the signal, a number of clock cycles during which the signal is in a low state, and a number of clock cycles during which the signal is in a high state.

15. A system comprising:

a memory storing instructions; and a processor, coupled with the memory and to execute the instructions, the instructions when executed cause the processor to:

determine a first portion of a first waveform from waveforms of signals of a plurality of logic circuits, the first waveform associated with a first signal of the signals, the first portion of the first waveform having at least a predetermined number of toggles during predetermined clock cycles of a plurality of clock cycles during emulation of the plurality of logic circuits;

convert the first portion of the first waveform into a plurality of bits, each bit of the plurality of bits representing a state of the first signal during a corresponding clock cycle;

simulate electronically one or more logic circuits of the plurality of logic circuits for first clock cycles of the plurality of clock cycles, the first clock cycles of the plurality of clock cycles corresponding to a second portion of the first waveform;

omit simulation of the one or more logic circuits for second clock cycles of the plurality of clock cycles corresponding to a third portion of the first waveform;

simulate electronically the one or more logic circuits based on the plurality of bits for third clock cycles of the plurality of clock cycles, the third clock cycles of the plurality of clock cycles corresponding to the first portion of the first waveform; and generate an output waveform of an output signal of a logic circuit from the one or more logic circuits for the plurality of clock cycles based on the simulation of the one or more logic circuits for the first clock cycles and the third clock cycles.

16. The system of claim 15, wherein the instructions that cause the processor to simulate the one or more logic circuits based on the plurality of bits for the third clock cycles of the plurality of clock cycles further cause a processing unit to obtain a portion of the output signal corresponding to the third clock cycles through a single opcode based on the plurality of bits.

17. The system of claim 15, wherein the instructions to generate the output waveform of the output signal of the logic circuit for the plurality of clock cycles further comprise instructions that when executed cause the processor to:

detect a periodic pattern in an input waveform of an input signal of the logic circuit for the first clock cycles;

determine a number of periodic patterns repeated in the input waveform of the input signal for the first clock cycles; and generate the output waveform of the output signal of the logic circuit for the plurality of clock cycles based on the periodic pattern and the number of the periodic patterns repeated.

18. The system of claim 17, wherein the instructions to cause the processor to generate the output waveform of the output signal of the logic circuit for the plurality of clock cycles further comprise instructions that when executed cause the processor to:

generate the output waveform of the output signal of the logic circuit for the second clock cycles to be in a predetermined state.

19. The system of claim 15, further comprising instructions that when executed by the processor cause the processor to:

determine a signal to be used as a reference signal of the logic circuit;

determine the first clock cycles of the plurality of clock cycles at which the reference signal is in a first state; and determine the second clock cycles of the plurality of clock cycles at which the reference signal is in a second state different from the first state.

20. The system of claim 15, wherein the waveforms of the signals received from the emulator are represented in switching activity interface format (SAIF), a waveform of a signal represented in the SAIF describing a number of toggles of the signal, a number of clock cycles during which the signal is in a low state, and a number of clock cycles during which the signal is in a high state.

* * * * *